(12) United States Patent
Dutta et al.

(10) Patent No.: US 9,252,147 B2
(45) Date of Patent: Feb. 2, 2016

(54) METHODS AND APPARATUSES FOR FORMING MULTIPLE RADIO FREQUENCY (RF) COMPONENTS ASSOCIATED WITH DIFFERENT RF BANDS ON A CHIP

(71) Applicant: QUALCOMM Incorporated, San Diego, CA (US)

(72) Inventors: Ranadeep Dutta, Del Mar, CA (US); Choh Fei Yeap, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 72 days.

(21) Appl. No.: 13/958,646

(22) Filed: Aug. 5, 2013

(65) Prior Publication Data
US 2015/0035072 A1  Feb. 5, 2015

(51) Int. Cl.
*H01L 29/76* (2006.01)
*H01L 27/092* (2006.01)
(Continued)

(52) U.S. Cl.
CPC ...... *H01L 27/0922* (2013.01); *H01L 21/82385* (2013.01); *H01L 21/823412* (2013.01); *H01L 21/823418* (2013.01); *H01L 21/823462* (2013.01); *H01L 21/823468* (2013.01); *H01L 21/823807* (2013.01); *H01L 21/823857* (2013.01); *H01L 27/088* (2013.01); *H01L 27/1203* (2013.01); *H03F 1/0277* (2013.01); *H03F 3/195* (2013.01); *H03F 3/245* (2013.01); *H03F 3/72* (2013.01); *H03F 2200/111* (2013.01); *H03F 2200/294* (2013.01); *H03F 2200/429* (2013.01); *H03F 2200/432* (2013.01); *H03F 2203/7209* (2013.01); *H03F 2203/7236* (2013.01)

(58) Field of Classification Search
CPC .................. H01L 21/82385; H01L 2924/1421
USPC ......................................................... 330/307
See application file for complete search history.

(56) References Cited

U.S. PATENT DOCUMENTS

| 6,107,134 A | 8/2000 | Lu et al. |
| 6,396,107 B1 | 5/2002 | Brennan et al. |

(Continued)

FOREIGN PATENT DOCUMENTS

| JP | 2012084636 A | 4/2012 |
| WO | 0124271 A1 | 4/2001 |
| WO | 2013024677 A1 | 2/2013 |

OTHER PUBLICATIONS

Bhat, N., et al., "Hot Carrier Reliability Considerations in the Integration of Dual Gate Oxide Transistor Process on a sub-0.25um CMOS Technology for Embedded Applications," Technical Digest, International Electron Devices Meeting, 1998; IEEE, Piscataway, NJ, pp. 931-934.

(Continued)

*Primary Examiner* — Daniel Whalen
(74) *Attorney, Agent, or Firm* — Toler Law Group, PC

(57) ABSTRACT

A method includes forming a first gate oxide in a first region and in a second region of a wafer. The method further includes performing first processing to form a second gate oxide in the second region. The second gate oxide has a different thickness than the first gate oxide. The method also includes forming first gate material of a first device in the first region and forming second gate material of a second device in the second region. The first device corresponds to a first radio frequency (RF) band and the second device corresponds to a second RF band that is different from the first RF band.

25 Claims, 8 Drawing Sheets

(51) Int. Cl.
    *H01L 21/8238*     (2006.01)
    *H01L 21/8234*     (2006.01)
    *H01L 27/088*     (2006.01)
    *H01L 27/12*     (2006.01)
    *H03F 3/195*     (2006.01)
    *H03F 1/02*     (2006.01)
    *H03F 3/24*     (2006.01)
    *H03F 3/72*     (2006.01)

(56) References Cited

U.S. PATENT DOCUMENTS

| | | |
|---|---|---|
| 6,500,739 B1 | 12/2002 | Wang et al. |
| 6,562,729 B2 | 5/2003 | Kamath et al. |
| 6,627,963 B2 | 9/2003 | Cochran et al. |
| 6,816,432 B2 | 11/2004 | Feurle et al. |
| 8,377,772 B2 | 2/2013 | Xiong et al. |
| 2002/0155686 A1 | 10/2002 | Lin et al. |
| 2005/0242398 A1 | 11/2005 | Chen et al. |
| 2010/0025770 A1* | 2/2010 | Trentzsch et al. .......... 257/369 |
| 2012/0025914 A1* | 2/2012 | Kim et al. ................. 330/291 |
| 2012/0228711 A1 | 9/2012 | Hoshino |
| 2013/0122833 A1* | 5/2013 | Hadjichristos et al. ...... 455/90.2 |

OTHER PUBLICATIONS

Fritzin, J., et al., "Low Voltage Class-E Power Amplifiers for DECT and Bluetooth in 130nm CMOS," IEEE Topical Meeting on Silicon Monolithic Integrated Circuits in RF Systems, 2009, IEEE, Piscataway, NJ, pp. 1-4.

Hong, J., et al., "Two-Stage Band-Selectable CMOS Power Amplifiers Using Inter-Stage Frequency Tuning," IEICE Transactions on Electronics, Feb. 2012, vol. E95-C, No. 2, The Institute of Electronics, Information and Communication Engineers, Tokyo, JP, pp. 290-296.

Leuschner, S., et al., "A 31-dBm, High Ruggedness Power Amplifier in 65-nm Standard CMOS with High-Efficiency Stacked-Cascode Stages," Radio Frequency Integrated Circuits Symposium (RFIC), 2010, IEEE, Piscataway, NJ, pp. 395-398.

Partial International Search Report for International Application No. PCT/US2014/047548, ISA/EPO, Date of Mailing Oct. 31, 2014, 9 pages.

International Search Report and Written Opinion for International Application No. PCT/US2014/047548, ISA/EPO, Date of Mailing Jan. 28, 2015, 27 pages.

\* cited by examiner

METHODS AND APPARATUSES FOR FORMING MULTIPLE RADIO FREQUENCY (RF) COMPONENTS ASSOCIATED WITH DIFFERENT RF BANDS ON A CHIP

I. FIELD

The present disclosure is generally related methods and apparatuses for forming multiple radio frequency (RF) components associated with different RF bands on a chip.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Long-term evolution (LTE) (e.g., 4G LTE) is a standard for wireless communication for high-speed data. The LTE standard specifies multiple frequency bands (e.g., multiple radio frequency (RF) bands) ranging from 0.7 gigahertz (GHz) to 2.6 GHz based on geographic region. For example, devices in North America will use 700/800 megahertz (MHz) frequency bands and 1,700/1.900 MHz frequency bands, and devices in Europe will use 800 MHz, 1,800 MHz, and 2,600 MHz frequency bands. Accordingly, for a wireless device to be compatible with multiple geographic regions, the wireless device must operate at each of the frequency bands. Additionally, the wireless device should be backwards compatible with prior standards (e.g., global system for mobile communication (GSM) standards, universal mobile telecommunications system (UMTS) standards, and wireless local area network (WLAN) standards).

To operate at multiple frequency bands, the wireless device includes multiple RF components that are each configured to operate (meet performance and reliability criteria) at a corresponding frequency band of the multiple frequency bands. For example, to operate in Europe, the wireless device includes a first power amplifier (PA) configured to operate in the 800 MHz frequency band, a second PA configured to operate in the 1,800 MHz frequency band, and a third PA configured to operate in the 2,600 MHz frequency band.

Each RF component for a particular frequency band is typically provided on a single chip, such as a chip formed using gallium arsenide (GaAs) or indium gallium phosphide (InGaP) chips. Accordingly, the wireless device includes multiple chips, each with different frequency-band-specific devices, to operate at multiple frequency bands. The use of multiple chips is expensive, requires a large footprint (e.g., printed circuit (PC) board area), and increases a size of the wireless device.

III. SUMMARY

The present disclosure provides methods of performing a complementary metal-oxide-semiconductor (CMOS) process on a wafer (e.g., a die) to form multiple radio frequency (RF) circuits (e.g., a first RF circuit and a second RF circuit) that each operate at different RF bands. For example, the wafer may include a silicon on insulator (SOI) wafer, a silicon on silicon (SOS) wafer, or a bulk silicon wafer. Each of the RF circuits may include a receiver, a transmitter, or a combination thereof. For example, a first RF circuit may be designed to operate at a first RF band, and a second RF circuit may be designed to operate at a second RF band. The CMOS process may include forming, on the first RF circuit, a first RF device having a first device type and a first characteristic and forming a second RF device having a second device type and a second characteristic on the second RF circuit. The first RF device and the second RF device are the same type of device (i.e., have a same device type), such as a power amplifier, an antenna switch, or a low noise amplifier. Additionally, the first characteristic and the second characteristic are the same type of characteristic (i.e., same characteristic type), such as an oxide thickness, a lightly doped region profile, or a halo profile. However, a value of the first characteristic is different than a value of the second characteristic. For example, when the characteristic type is an oxide thickness, a first oxide thickness of the first device may be thicker than a second oxide thickness of the second device. The value of the first characteristic may be determined to enable the first RF circuit to operate at the first RF band, and the value of the second characteristic may be determined to enable the second RF circuit to operate at the second RF band.

In a particular embodiment, a method includes forming a first gate oxide in a first region and in a second region of a wafer. The method further includes performing first processing to form a second gate oxide in the second region. The second gate oxide has a different thickness than the first gate oxide. The method also includes forming first gate material of a first device in the first region and forming second gate material of a second device in the second region. The first device corresponds to a first radio frequency (RF) band, and the second device corresponds to a second RF band that is different from the first RF band.

In a particular embodiment, a device includes a first radio frequency (RF) component and a second RF component on a die. The first RF component corresponds to a first RF band, and the second RF component corresponds to a second RF band that is different from the first RF band. The first RF component includes a first gate oxide having a first thickness, and the second RF component includes a second gate oxide having a second thickness that is different from the first thickness.

In a further particular embodiment, an apparatus includes a first radio frequency (RF) component corresponding to a first RF band, and a second RF component corresponding to a second RF band that is different from the first RF band. The first RF component includes first means for gating a first channel. The first channel is positioned between first means for sourcing first current to the first channel and first means for draining the first current from the first channel. The means for gating the channel is isolated from first semiconductor means for conducting first charge carriers by a first insulator. The second RF component includes second means for gating a second channel. The second channel is positioned between second means for sourcing second current to the second channel and second means for draining the second current from the second channel. The second means for gating the second channel is isolated from second semiconductor means for conducting second charge carriers by a second insulator. A first thickness of the first insulator is different than a second thickness of the second insulator.

In another particular embodiment, a non-transitory computer-readable medium includes instructions that, when executed by a processor, cause the processor to initiate formation of a complementary metal-oxide-semiconductor (CMOS) device. The formation of the CMOS device includes forming a first gate oxide in a first region and in a second region of a wafer. The CMOS device is further formed by performing first processing to form a second gate oxide in the second region. The second gate oxide has a different thickness than the first gate oxide. The formation of the CMOS device also includes forming first gate material of a first device in the first region and forming second gate material of a second device in the second region. The first device corresponds to a first radio frequency (RF) band, and the second device corresponds to a second RF band that is different from the first RF band.

In another particular embodiment, a device includes a first radio frequency (RF) component and a second RF component on a die. The first RF component corresponds to a first RF band, and the second RF component corresponds to a second RF band that is different from the first RF band. The first RF component includes a first lightly doped region having a first value of a characteristic, and the second RF component includes a second lightly doped region having a second value of the characteristic that is different from the first value.

In another particular embodiment, a device includes a first radio frequency (RF) component and a second RF component on a die. The first RF component corresponds to a first RF band, and the second RF component corresponds to a second RF band that is different from the first RF band. The first RF component includes a first halo region having a first value of a characteristic, and the second RF component includes a second halo region having a second value of the characteristic that is different from the first value.

In another particular embodiment, a method includes a first step for forming a first gate oxide in a first region and in a second region of a wafer. The method further includes a second step for performing first processing to form a second gate oxide in the second region, the second gate oxide having a different thickness than the first gate oxide. The method also includes a third step for forming first gate material of a first device in the first region and forming second gate material of a second device in the second region. The first device corresponds to a first radio frequency (RF) band, and the second device corresponds to a second RF band that is different from the first RF band.

In another particular embodiment, a method includes performing, on a wafer, a complementary metal-oxide-semiconductor (CMOS) process to form a first radio frequency (RF) circuit and a second RF circuit. The first RF circuit is designed to operate at a first RF band and the second RF circuit is designed to operate at a second RF band. Performing the CMOS process includes forming a first RF device of the first RF circuit and forming a second RF device of the second RF circuit. The first RF device has a first device type and a first value of a characteristic, and the second RF device has a second device type and a second value of the characteristic. The first device type and the second device type are a same device type, and the first value of the characteristic is different from the second value of the characteristic.

In another particular embodiment, a method includes receiving design information representing at least one physical property of a semiconductor device. The semiconductor device includes a first radio frequency (RF) component and a second RF component on a die. The first RF component corresponds to a first RF band, and the second RF component corresponds to a second RF band that is different from the first RF band. The first RF component includes a first gate oxide having a first thickness, and the second RF component includes a second gate oxide having a second thickness that is different from the first thickness. The method further includes transforming the design information to comply with a file format and generating a data file including the transformed design information.

One particular advantage provided by at least one of the disclosed embodiments is that a single die may advantageously include multiple RF band circuits that are each designed for performance and reliability at a corresponding frequency band. The die may have a smaller form factor and may be produced at a reduced cost as compared to including a RF circuit on a separate chip for each frequency band.

Other aspects, advantages, and features of the present disclosure will become apparent after review of the entire application, including the following sections: Brief Description of the Drawings. Detailed Description, and the Claims.

IV. BRIEF DESCRIPTION OF THE DRAWINGS

FIG. 1 is a block diagram of a first illustrative embodiment of a device having a die that accommodates multiple radio frequency (RF) bands;

FIGS. 2A-B are block diagrams of illustrative embodiments of complementary metal-oxide-semiconductor (CMOS) devices that accommodate multiple RF bands;

V. DETAILED DESCRIPTION

Particular embodiments of the present disclosure are described below with reference to the drawings. In the description, common features are designated by common reference numbers throughout the drawings.

Figure 1:
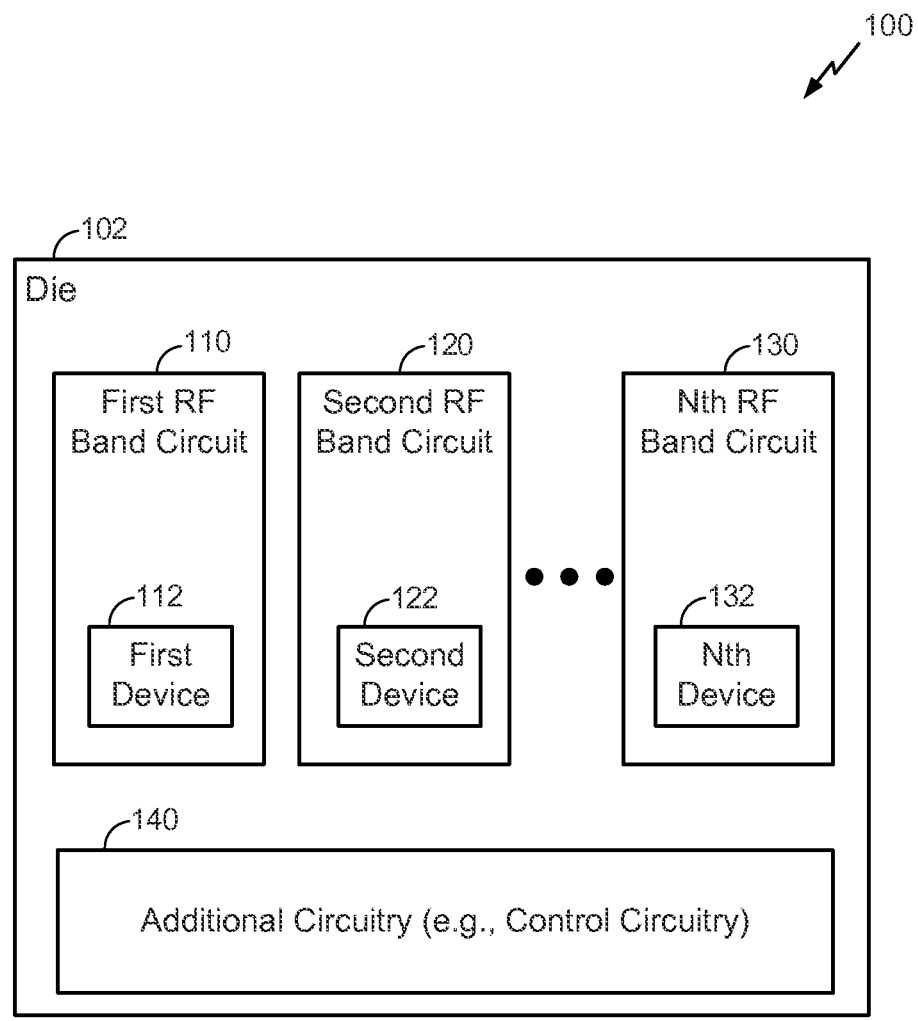

Referring to FIG. 1, a device 100 (e.g., a communication device) that accommodates multiple radio frequency (RF) bands is shown. The device 100 includes a die 102 having multiple RF circuits, such as a first RF band circuit 110, a second RF band circuit 120, an Nth RF band circuit 130, and additional circuitry 140. The die 102 may be packaged in (e.g., incorporated in) a chip, such as a semiconductor chip. Although the die 102 is shown as including the additional circuitry 140, the additional circuitry 140 may be coupled to the die 102 but not be included in the die 102. The device 100 may include a communication device, such as a portable communication device) configured for RF communication. The device 100 may include one or more additional components or circuits (not shown), such as a processor (e.g., a digital signal processor), a wireless transceiver, a memory, an antenna, one or more other components, or a combination thereof.

The multiple RF circuits 110, 120, 130, the additional circuitry 140, or a combination thereof, may be formed by a front end process, such as a front end complementary metaloxide-semiconductor (CMOS) process. The front end process may be performed with respect to a wafer (e.g., from which the die 102 is created), as described further herein. As a result of the front end process, the die 102 includes multiple RF circuits (e.g., the first RF band circuit 110, the second RF band circuit 120, the Nth RF band circuit 130), and the additional circuitry 140 (e.g., control circuitry). Although the die 102 shows three different RF band circuits 110, 120, 130, the die 102 may include two RF band circuits or more than three RF band circuits.

Each of the RF band circuits 110, 120, 130 may include one or more components. For example, the first RF band circuit 110 may include a first device 112, the second RF band circuit 120 may include a second device 122, and the Nth RF band circuit 130 may include an Nth device 132. Each of the first device 112, the second device 122, and the Nth device may be a same device type, such as a power amplifier, an antenna switch, or a low noise amplifier and may be constructed during a single front end process flow. Each of the RF band circuits 110, 120, 130 may correspond to a different RF band. For example, each of the RF band circuits 110, 120, 130 may be designed to operate at a different RF band and within a corresponding electrical domain of operation as compared to the others of the RF band circuits 110, 120, and 130. The first RF band circuit 110 may be designed to operate at a lower RF band than the second RF band circuit 120. Accordingly, each of the devices 112, 122, 132 may be designed (e.g., optimized) to operate at the RF band, the electrical domain of operation, or a combination thereof, corresponding to the RF band circuit 110, 120, 130 that includes the device 112, 122, or 132. Each of the devices 112, 122, 132 may be configured with a different value of a same characteristic (e.g., a characteristic type), such as described further with reference to FIGS. 2A-B. For example, the devices 112, 122, 132 may have different values of an oxide thickness (e.g., a gate oxide thickness), different values associated with a lightly doped region profile, different values associated with a halo profile, or a combination thereof. For example, the first device 112 may have a first oxide thickness, the second device 122 may have a second oxide thickness different from the first oxide thickness, and the Nth device 132 may have a third oxide thickness that is different from the first oxide thickness and the second oxide thickness.

The additional circuitry 140 may be coupled to each of the RF band circuits 110, 120, 130. The additional circuitry 140 may be configured to operate the device 100 in different modes, such as different combinations of frequency bands. For example, the additional circuitry 140 may be configured to select one or more of the RF band circuits 110, 120, 130 of the device 100 for operation based on particular circumstances.

For example, during operation of the device 100, the additional circuitry 140 may determine or receive an indication (e.g., from a processor or positioning system of the device 100) of the geographic location in which the device 100 is located. Based on the geographic location, the additional circuitry 140 may selectively activate (e.g., enable to operate) or deactivate one or more of the RF band circuits 110, 120, 130. Alternatively, one or more of the RF band circuits 110, 120, 130 may be selected for operation based on other criteria, such as programmable settings.

During operation, the additional circuitry 140 may determine that the device 100 is located in North America, which uses 700/800 MHz frequency bands and 1,700/1,900 MHz frequency bands. Based on the device 100 being located in North America, the additional circuitry 140 may selectively activate, deactivate, or a combination thereof, one or more of the RF band circuits 110, 120, 130 to enable the device 100 to operate at the 700/800 MHz frequency bands and the 1,700/1,900 MHz frequency bands. After the device 100 is configured to operate in North America, the additional circuitry 140 may determine that the device is located in Europe (e.g., if a user of a wireless phone travels from North America to Europe), which uses 800 MHz, 1,800 MHz, and 2,600 MHz frequency bands. Based on the device 100 being located in Europe, the additional circuitry 140 may selectively activate, deactivate, or a combination thereof, one or more of the RF band circuits 110, 120, 130 to enable the device 100 to operate at the 800 MHz, 1,800 MHz, and 2,600 MHz frequency bands.

The die 102 of device 100 may advantageously include multiple RF band circuits 110, 120, 130 that are each designed for performance and reliability at a corresponding frequency band. The device 100 may have a smaller form factor and may be produced at a reduced cost as compared to using multiple RF circuits that are constructed on multiple dies.

Figure 2A:
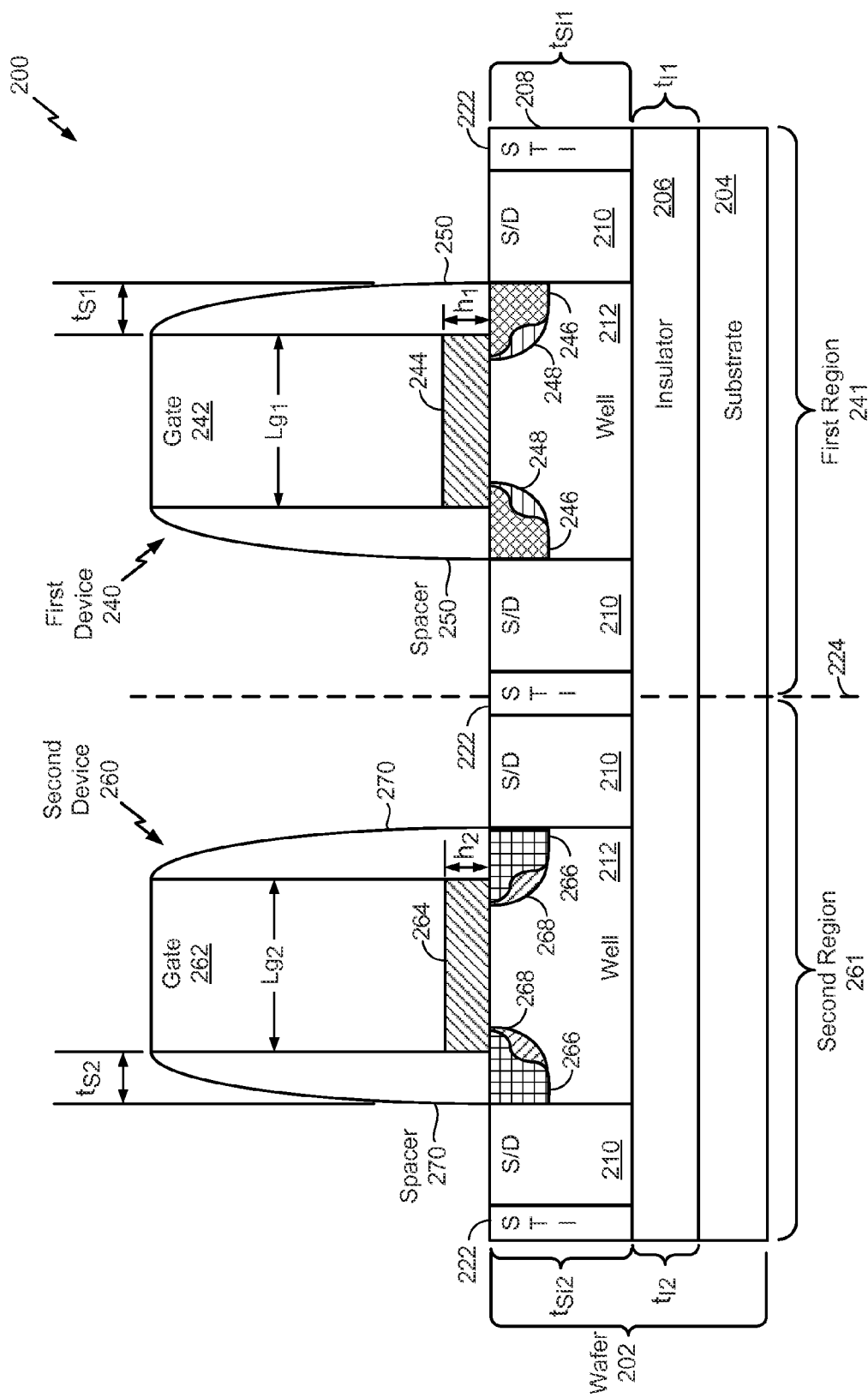
Figure 2B:
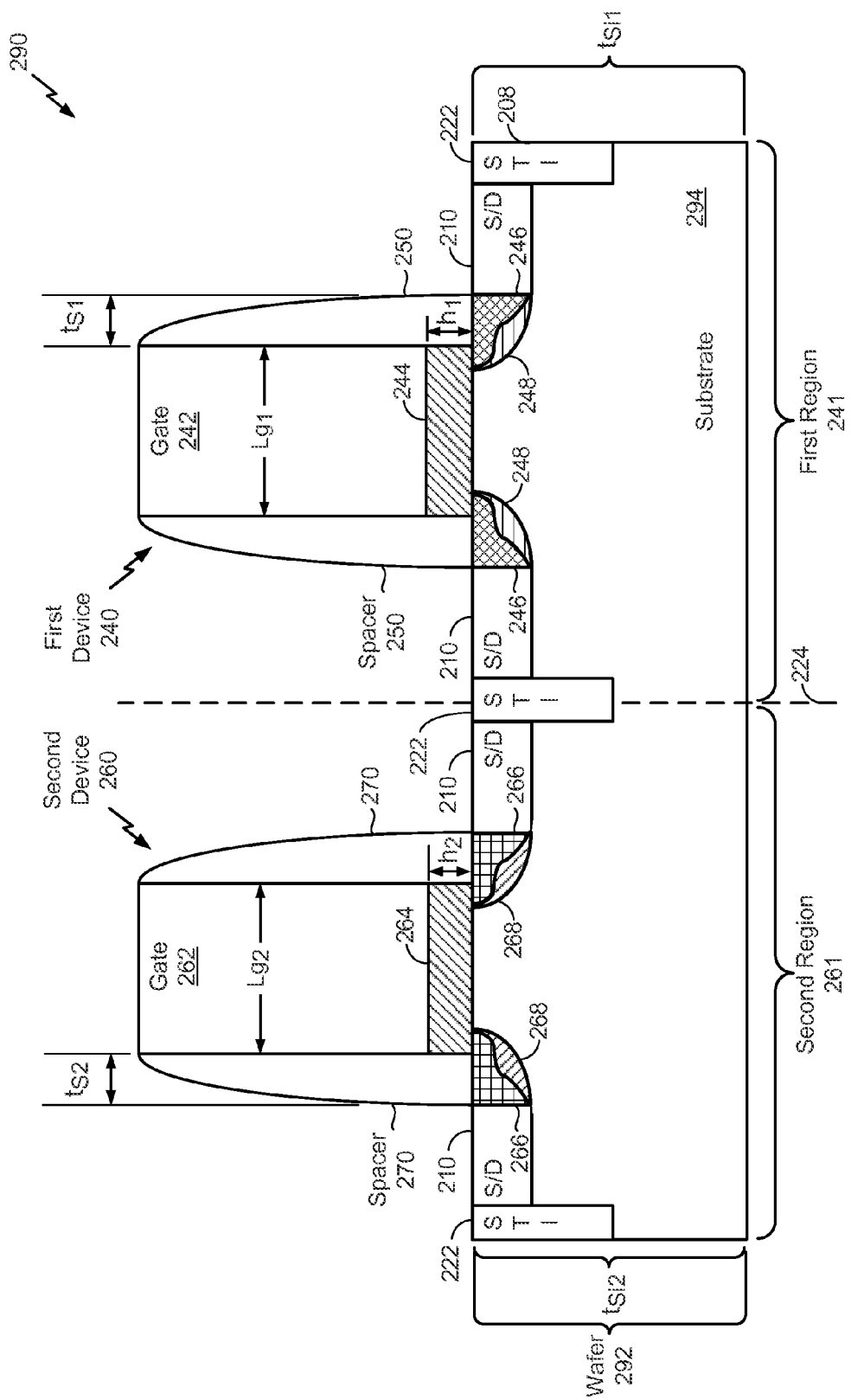

Referring to FIGS. 2A-B, illustrative embodiments of complementary metal-oxide-semiconductor (CMOS) devices that accommodate multiple RF bands are disclosed. The CMOS devices may include a silicon on insulator (SOI) CMOS device, a silicon on silicon (SOS) CMOS device, or a bulk silicon CMOS device. FIG. 2A illustrates a first CMOS device 200 that is a silicon on insulator (SOI) CMOS device. FIG. 2B illustrates a second CMOS device 290 that is a bulk silicon CMOS device. One or more dies, such as the die 102 of FIG. 1, may be created from the first CMOS device 200 or the second CMOS device 290.

Referring to FIG. 2A, the first CMOS device 200 includes a wafer 202 onto which a first device 240 and a second device 260 are formed. The first device 240 may be associated with a first radio frequency (RF) band and the second device 260 may be associated with a second RF band. For example, the first device 240 and the second device 260 may each correspond to a different one of the devices 112, 122, 132 of FIG. 1. Although each of the first device 240 and the second device 260 is illustrated as a single transistor for ease of explanation, the first device 240 and the second device 260 are not limited to a single transistor. For example, each of the first device 240 and the second device 260 may be a same device type, such as a power amplifier, an antenna switch, or a low noise amplifier, and may be constructed during a single front end process flow. Each of the first device 240 and the second device 260 may be designed to operate at a different RF band and within a corresponding electrical domain of operation. A dashed line 224 illustrates a representative logical division of the first CMOS device 200 into a first portion and a second portion. One of skill in the art will appreciate that although the first CMOS device 200 depicts two devices 240, 260, the first CMOS device 200 may include more than two devices.

The first CMOS device 200 may include a substrate 204, an insulator material 206 (e.g., a dielectric insulator), and a semiconducting layer 208 (e.g., a semiconductor layer, such as a silicon (Si) layer). In a particular embodiment, the substrate 204 includes silicon (Si), the insulator material 206 may include a buried oxide (BOX), and the semiconducting layer 208 may include silicon (Si). In a particular embodiment, the substrate 204, the insulator material 206, and the semiconducting layer 208 are included in the wafer 202.

The insulator material 206, the semiconducting layer 208, or a combination thereof, may include a first region 241 corresponding to the first device 240 and a second region 261 corresponding to the second device 260. The insulator material 206 of the first region 241 may have a first insulator material thickness $t_{I1}$ and the insulator material 206 of the second region 261 may have a second insulator material thickness $t_{I2}$. The first insulator material thickness $t_{I1}$ and the second insulator material thickness $t_{I2}$ may be the same thickness or different thicknesses. The semiconducting layer 208 of the first region 241 may have a first semiconducting layer thickness $t_{Si1}$ and the semiconducting layer 208 of the second region 261 may have a second semiconducting layer thickness $t_{Si2}$. The first semiconducting layer thickness $t_{Si1}$ and the second semiconducting layer thickness $t_{Si2}$ may be the same thickness or different thicknesses.

The first region 241 and the second region 261 may be separated by a shallow trench isolation (STI) region 222. Each of the first region 241 and the second region 261 may include source/drain (S/D) implants 210 and a well region 212. Either S/D implant 210 of the first device 240 and either S/D implant 210 of the second device 260 may be associated with a source or associated with a drain of the corresponding transistor, as long as the first device 240 has a source and a drain and the second device 260 has a source and a drain.

The first device 240 may include a first gate 242 and a first gate oxide 244. The first gate 242 and the first gate oxide 244 may be positioned above a first channel region of the semiconducting layer 208 of the first region 241. The first gate 242 may define a first channel length $Lg_1$, and the first gate oxide 244 may have a height $h_1$ (e.g., a first gate oxide thickness). The first gate 242, the first gate oxide 244, or a combination thereof, may have first spacers 250 attached thereto. For example, the first spacers 250 may be formed on the first gate 242. The first spacers 250 may have a first spacer thickness $t_{S1}$, and a first spacer profile (e.g., a volume, a cross sectional area, or a cross sectional shape). The first device 240 may further include a first lightly doped region 246 (e.g., a lightly doped implant) and a first halo region 248 (e.g., a halo implant). The first lightly doped region 246 and the first halo region 248 may be included within the well region 212 of the first region 241. The first lightly doped region 246 may include a first lightly doped characteristic. The first lightly doped characteristic may include a first lightly doped profile (e.g., a volume, a cross sectional area, or a cross sectional shape of the first lightly doped region 246), a first lightly doped dopant type, a first lightly doped dopant concentration, or a combination thereof. The first halo region 248 may include a first halo characteristic. The first halo characteristic may include a first halo profile (e.g., a volume, a cross sectional area, or a cross sectional shape of the first halo region 248), a first halo dopant type, a first halo dopant concentration, or a combination thereof.

The second device 260 may include a second gate 262 and a second gate oxide 264. The second gate 262 and the second gate oxide 264 may be positioned above a second channel region of the semiconducting layer 208 of the second region 261. The second gate 262 may define a second channel length $Lg_2$, and the second gate oxide 264 may have a height $h_2$ (e.g., a second gate oxide thickness). The second gate 262, the second gate oxide 264, or a combination thereof, may have second spacers 270 attached thereto. For example, the second spacers 270 may be formed on the second gate 262. The second spacers 270 may have a second spacer thickness $t_{S2}$ and a second spacer profile (e.g., a volume, a cross sectional area, or a cross sectional shape). The second device 260 may further include a second lightly doped region 266 and a second halo region 268. The second lightly doped region 266 and the second halo region 268 may be included within the well region 212 of the second region 261. The second lightly doped region 266 may include a second lightly doped characteristic. The second lightly doped characteristic may include a second lightly doped profile (e.g., a volume, a cross sectional area, or a cross sectional shape of the second lightly doped region 266), a second lightly doped dopant type, a second lightly doped dopant concentration, or a combination thereof. The second halo region 268 may include a second halo characteristic. The second halo characteristic may include a second halo profile (e.g., a volume, a cross sectional area, or a cross sectional shape of the second halo region 268), a second halo dopant type, a second halo dopant concentration, or a combination thereof.

Values of one or more characteristics of the first device 240 and the second device 260 may differ based on the corresponding frequency band of the first device 240 and the second device 260. For example, the first channel length $Lg_1$ of the first gate 242 may be the same length or a different length than the second channel length $Lg_2$ of the second gate 262. The height $h_1$ of the first gate oxide 244 may be the same height or a different height as the height $h_2$ of the second gate oxide 264. The first spacer thickness $t_{S1}$ of the first spacers 250 may be the same thickness or a different thickness than the second spacer thickness $t_{S2}$ of the second spacers 270. A value of the first lightly doped characteristic of the first lightly doped region 246 may be the same as or different than a corresponding value of the second lightly doped characteristic of the second lightly doped region 266. A value of the first halo characteristic of the first halo region 248 may be the same as or different than a corresponding value of the second halo characteristic of the second halo region 268.

Referring to FIG. 2B, the second CMOS device 290 includes a wafer 292 onto which the first device 240 and the second device 260 are formed. The wafer 292 may include a substrate 294, such as silicon. The substrate 294 may include a first region 241 corresponding to the first device 240 and a second region 261 corresponding to the second device 260. The substrate 294 may include the STI regions 222, the S/D implants 210, the first lightly doped region 246, the first halo region 248, the second lightly doped regions 266, and the second halo region 268.

Referring to FIGS. 2A-B, the first device 240 and the second device 260 are a same device type, and each of first device 240 and the second device 260 is designed to operate at a different RF band and within a different corresponding electrical domain of operation. For example, the first device 240 may be designed to operate at a lower RF band than the second device 260. Accordingly, the first device 240 may be referred to as a low band device, and the second device 260 may be referred to as a high band device. In a particular embodiment, the first device 240 is a low band power amplifier, and the second device 260 is a high band power amplifier.

When the first device 240 is the low band device and the second device 260 is the high band device, one or more attributes (e.g., one or more characteristic values) of the first device 240 and the second device 260 may be determined based on the frequency band in which each device is designed to operate. As a first example, the first insulator material thickness $t_{I1}$ may be thicker than the second insulator material thickness $t_{I2}$. As a second example, the first semiconducting layer thickness $t_{Si1}$ may be thicker than the second semiconducting layer thickness $t_{Si12}$. As a third example, the first channel length $Lg_1$ of the first gate 242 may be longer than the second channel length $Lg_2$ of the second gate 262. As a fourth example, the height $h_1$ of the first gate oxide 244 may be larger (e.g., thicker) than the height $h_2$ of the second gate oxide 264. As a fifth example, the first spacer thickness $t_{S1}$ of the first spacers 250 may be thicker than the second spacer thickness $t_{S2}$ of the second spacers 270. As a sixth example, a first cross sectional area of the first spacer profile of the first spacers 250 may be larger than a second cross sectional area of the second spacer profile of the second spacers 270.

As a seventh example, a first cross sectional area of the first lightly doped profile of the first lightly doped region 246 may be larger than a second cross sectional area of the second lightly doped profile of the second lightly doped region 266. As an eighth example, the first lightly doped dopant type of the first lightly doped region 246 may be a first lightly doped dopant having a larger molecular mass (e.g., molecular weight) than a second lightly doped dopant of the second lightly doped dopant type of the second lightly doped region 266. As a ninth example, the first lightly doped dopant concentration of the first lightly doped region 246 may be a greater dopant concentration (e.g., a doping concentration) than the second lightly doped dopant concentration of the second lightly doped region 266.

As a tenth example, a first cross sectional area of the first halo profile of the first halo region 248 may be larger than a second cross sectional area of the second halo profile of the second halo region 268. As an eleventh example, the first halo dopant type of the first halo region 248 may be a first halo dopant having a larger molecular mass (e.g., molecular weight) than a second halo dopant of the second halo dopant type of the second halo region 268. As a twelfth example, the first halo dopant concentration (e.g., a doping concentration) of the first halo region 248 may be a greater dopant concentration than the second halo dopant concentration of the second halo region 268.

One or more of the examples described above may be incorporated in or otherwise utilized by the first CMOS device 200 of FIG. 2A or the second CMOS device 290 of FIG. 2B based on the RF bands for the first region 241 and the second region 261. Thus, a single die of the first CMOS device 200 of FIG. 2A or the second CMOS device 290 of FIG. 2B may advantageously include multiple RF devices that are each designed for performance and reliability at a corresponding frequency band. The first CMOS device 200 of FIG. 2A or the second CMOS device 290 of FIG. 2B may have a smaller form factor and may be produced at a reduced cost as compared to RF circuits that are constructed on separate wafers or separate chips. Examples of forming/fabricating a semiconductor device, such as the first CMOS device 200 of FIG. 2A or the second CMOS device 290 of FIG. 2B, are described with reference to FIGS. 3-5.

Figure 3:
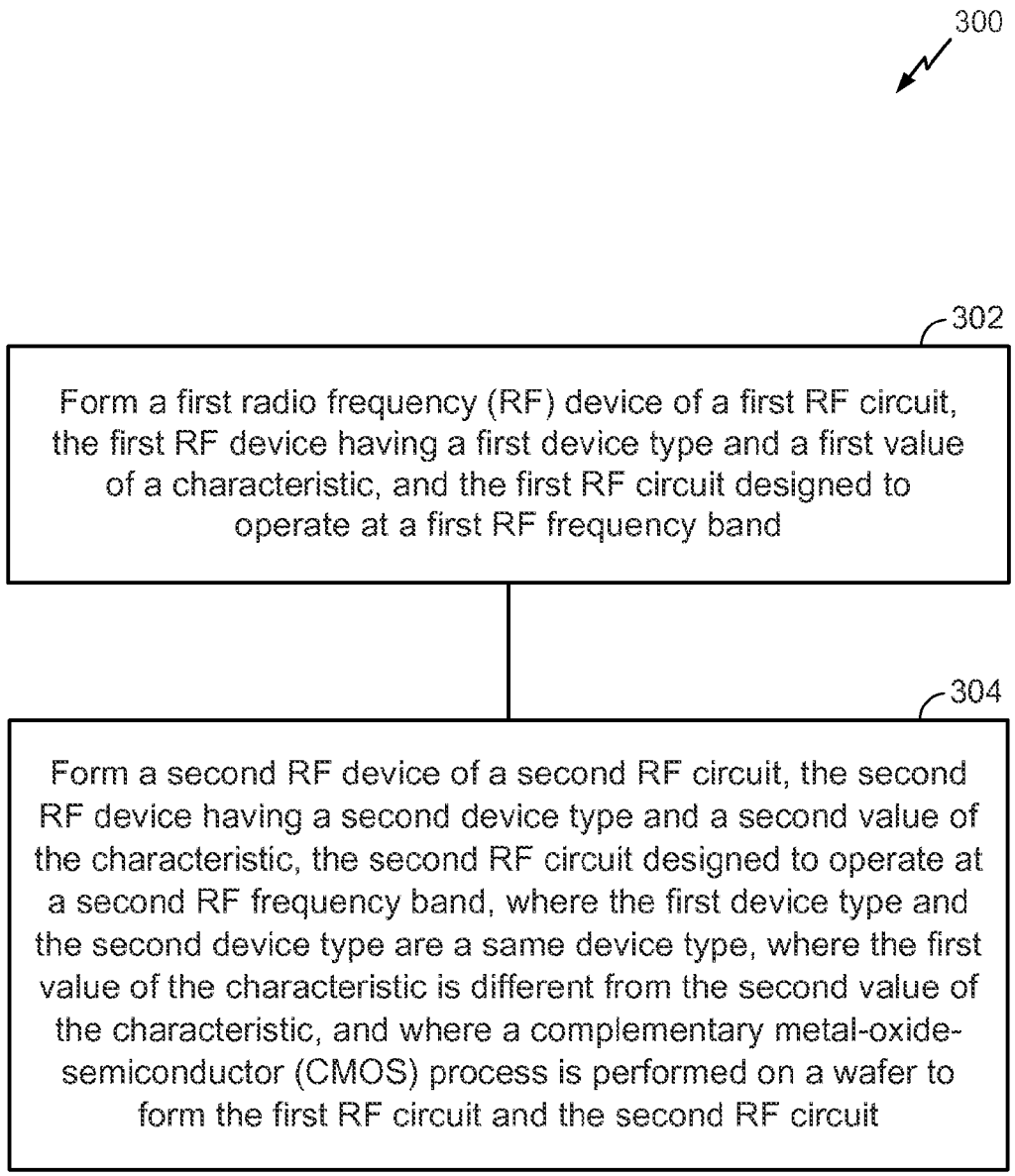
FIG. 3 is a flow diagram of an illustrative embodiment of a first method to form a die that accommodates multiple RF bands.

Referring to FIG. 3, a first illustrative embodiment of a method 300 to form a single die that accommodates multiple RF bands is illustrated. The single die may be formed by a complementary metal-oxide-semiconductor (CMOS) process performed on a wafer. For example, the single die may include the die 102 of FIG. 1, a die of the first CMOS device 200 of FIG. 2A, or a die of the second CMOS device 290 of FIG. 2B.

A first radio frequency (RF) device of a first RF circuit is formed, at 302. The first RF device has a first device type (e.g., first component type) and a first value of a characteristic. The first RF circuit is designed to operate at a first RF band. For example, the first RF device may correspond to or be associated with one of the devices 112, 122, 132 of FIG. 1 or one of the first device 240 or the second device 260 of FIGS. 2A-B.

A second RF device of a second RF circuit is formed, at 304. The second RF device has a second device type (e.g., a second component type) and a second value of the characteristic. For example, the second RF device may correspond to or be associated with one of the devices 112, 122, 132 of FIG. 1 or one of the first device 240 or the second device 260 of FIGS. 2A-B. The second RF circuit is designed to operate at a second RF band. The first device type and the second device type are a same device type (e.g., a same component type). The first value of the characteristic is different than the second value of the characteristic. The first RF circuit and the second RF circuit are formed by a complementary metal-oxide-semiconductor (CMOS) process performed on a wafer, such as a silicon on insulator (SOI) wafer, a silicon on silicon (SOS) wafer, or a bulk silicon wafer.

Thus, a method of forming a single chip that accommodates multiple RF bands has been described. The first device and the second device are designed to operate at different RF bands. For example, the first device may be designed to operate at a first frequency band, and the second device may be designed to operate at a second frequency band. In a particular embodiment, the first frequency band is a lower frequency band than the second frequency band. Each device may be configured based on a corresponding frequency band by adjusting one or more parameters (e.g., one or more characteristic values) of the device, such as a channel length, a gate oxide thickness, a lightly doped region profile volume or cross sectional area, a halo region profile volume or cross sectional area, a silicon layer thickness, a buried oxide layer thickness, or a spacer thickness during the CMOS process, as described further with reference to FIGS. 4 and 5.

Figure 4:
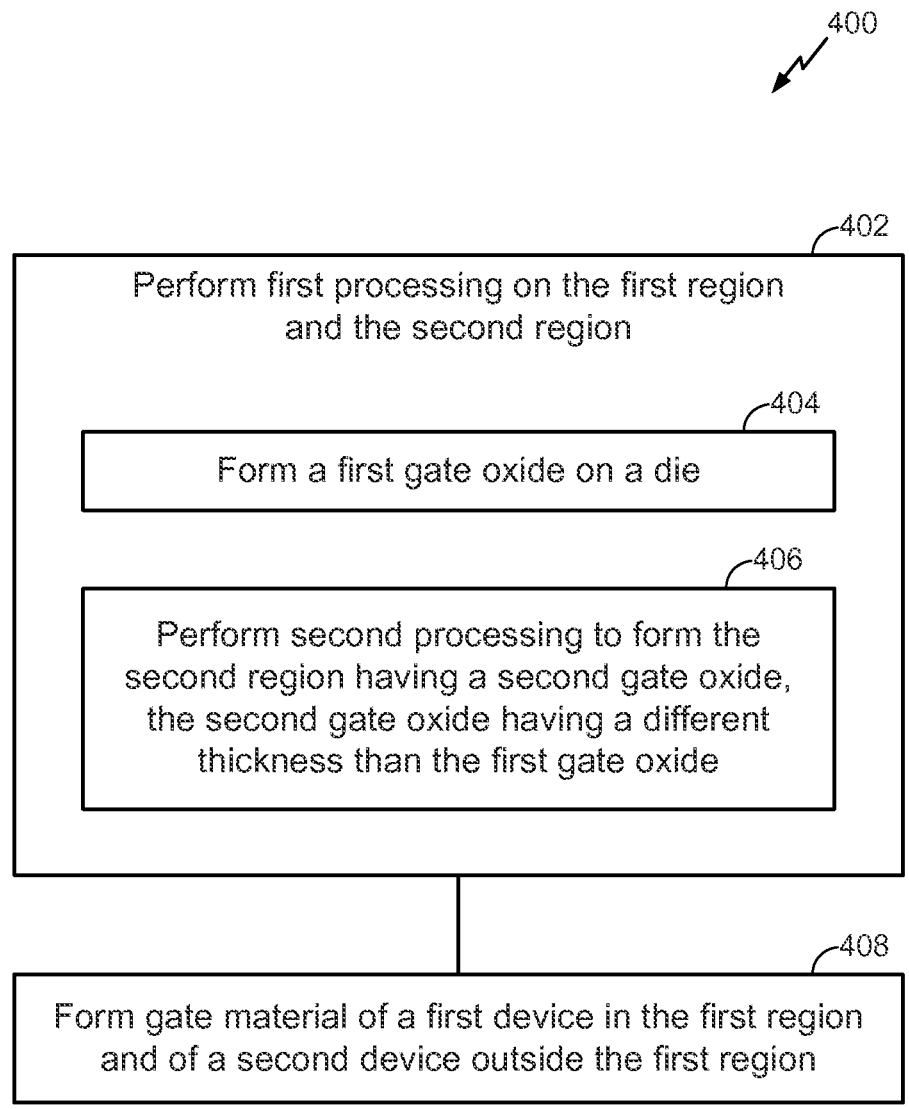
FIG. 4 is a flow diagram of an illustrative embodiment of a second method to form a die that accommodates multiple RF bands.

Referring to FIG. 4, a second illustrative embodiment of a method to form a single die that accommodates multiple RF bands is illustrated and designated 400. For example, the single die may include the die 102 of FIG. 1, a die of the first CMOS device 200 of FIG. 2A, or a die of the second CMOS device 290 of FIG. 2B.

First processing is performed on a first region and a second region, at 402. The first processing may be configured to construct (e.g., fabricate) a first device to operate at a first RF band and to construct a second device to operate at a second RF band. For example, the first device and the second device may each be associated with a different one of the devices 112, 122, 132 of FIG. 1 or the first device 240 and the second device 260 of FIGS. 2A-B.

The first processing may include forming a first gate oxide on the die, at 404, and the first processing may include performing second processing to form a second gate oxide on the second region, at 406. The first gate oxide may be formed on the first region (e.g., the first region 241 of FIGS. 2A-B) and on the second region (e.g., the second region 261 of FIGS. 2A-B). The second processing may include performing thin gate lithography to cover (e.g., protect) the first gate oxide in the first region and to expose (e.g., leave uncovered) the first gate oxide on the second region, removing the first gate oxide from the second region, and forming the second gate oxide on the second region (e.g., the second gate oxide 264 in the second region 261). Accordingly, the second gate oxide may have a different thickness than the first gate oxide. For example, when the first device is configured to operate at a lower frequency than the second device, the first gate oxide may be thicker than the second gate oxide. Alternatively, the second processing may include performing thin gate lithography to cover (e.g., protect) the first gate oxide in the first region and to expose (e.g., leave uncovered) the first gate oxide on the second region and forming the second gate oxide on the second region by adding additional gate oxide material to the first gate oxide in the first region.

First gate material of a first device may be formed on the first region, and second gate material of a second device may be formed on the second region, at 408. To illustrate, polysilicon may be formed over the gate oxide in both regions in a common depositing/lithography/etching process. For example, the first device may correspond to one of the first device 112, the second device 122, and the Nth device 132 of FIG. 1, or the first device 240 and the second device 260 of FIGS. 2A-B, and the second device may correspond to another one of the first device 112, the second device 122, and the Nth device 132 of FIG. 1, or the first device 240 and the second device 260 of FIGS. 2A-B. The first device and the second device may each be designed to operate at different radio frequency bands. For example, the first device may correspond to a first radio frequency (RF) band, and the second device may correspond to a second RF band that is different from the first RF band. In a particular embodiment, the first device is a first power amplifier and the second device is a second power amplifier.

Figure 5:
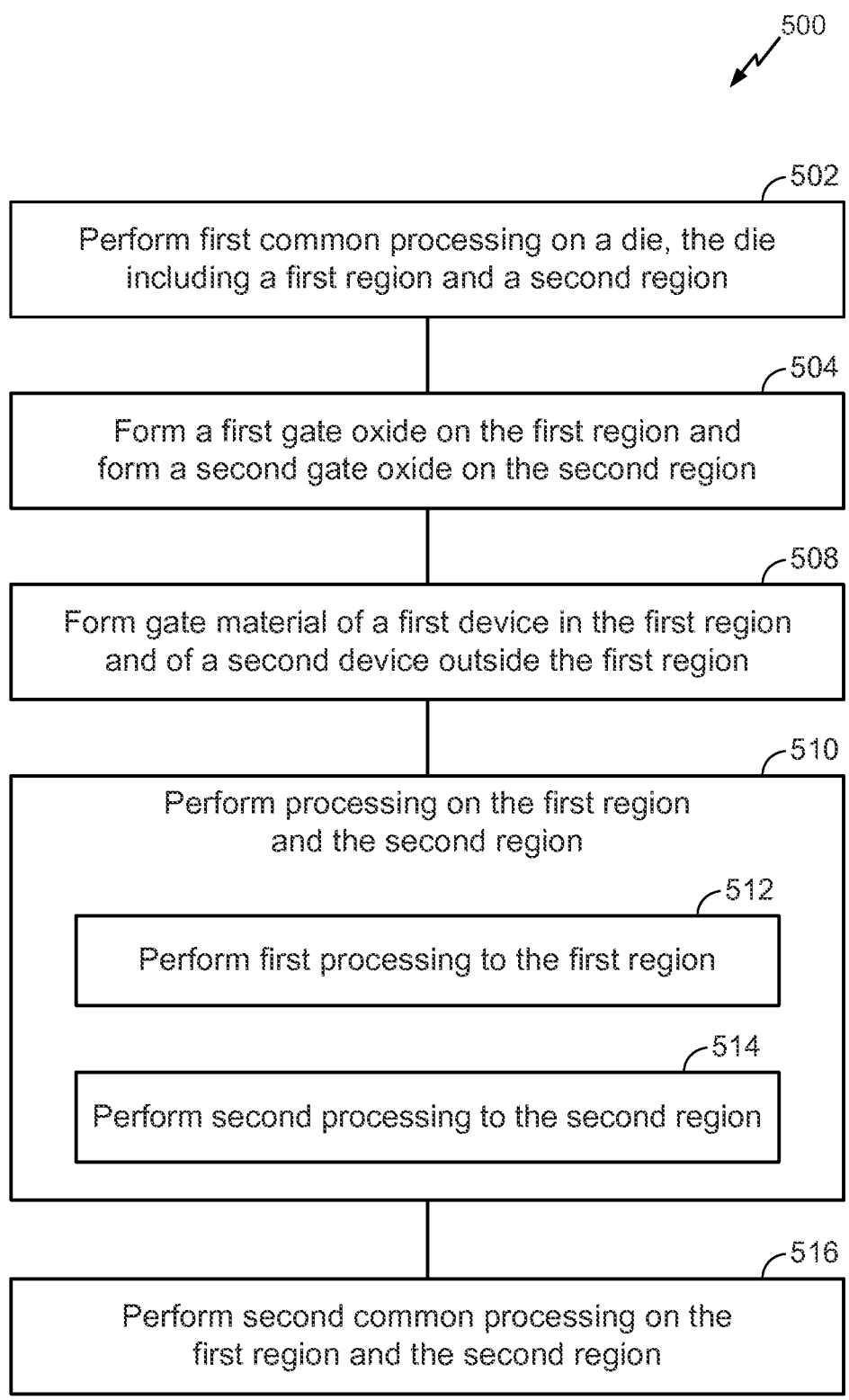
FIG. 5 is a flow diagram of an illustrative embodiment of a third method to form a die that accommodates multiple RF bands.

Referring to FIG. 5, a third illustrative embodiment of a method to form a single die that accommodates multiple RF bands is illustrated and designated 500. For example, the single die may include the die 102 of FIG. 1. The method may include a complementary metal-oxide-semiconductor (CMOS) process.

Common processing steps may be performed on a wafer, at 502. The wafer, such as a silicon on insulator (SOI) wafer, a silicon on silicon (SOS) wafer, or a bulk silicon wafer, may include a first region and a second region, such as the first region 241 and the second region 261 of FIGS. 2A-B. The first region may be associated with a first device designed to operate at a first RF band, and the second region may be associated with a second device designed to operate at a second RF band. For example, the first device may correspond to one of the first device 112, the second device 122, and the Nth device 132, of FIG. 1, or the first device 240 and the second device 260 of FIGS. 2A-B, and the second device may correspond to another one of the first device 112, the second device 122, and the Nth device 132, of FIG. 1, or the first device 240 and the second device 260 of FIGS. 2A-B. The first device and the second device may each be designed to operate at different radio frequency bands. In a particular embodiment, the first device is a first power amplifier, and the second device is a second power amplifier. The wafer may include the wafer 202 of FIG. 2A, such as a silicon on insulator wafer having a substrate layer, an insulator material layer, and a semiconducting layer (e.g., a silicon layer) or may include the wafer 292 of FIG. 2B, such as a bulk silicon wafer. The common processing may include forming shallow trench isolation regions, p well regions, n well regions, one or more other semiconductor process components, or a combination thereof.

Wafer processing may be performed on the wafer prior to performing the common processing. For example, the wafer processing may include configuring a first thickness of the silicon layer of the first region to be thicker than a second thickness of the silicon layer of the second region when the first device is designed to operate at a lower RF band than the second device. As another example, when the first device is designed to operate at a lower RF band than the second device, the wafer processing may include configuring a first thickness of the buried oxide layer of the first region to be thicker than a second thickness of the buried oxide layer of the second region.

A first gate oxide may be formed on the first region, and a second gate oxide may be formed on the second region, at 504. The first gate oxide and the second gate oxide may have a same or a different thickness. The first oxide (e.g., a thickness of the first oxide) may be configured to enable the first device to operate in a first electrical domain of operation corresponding to a first RF band, and the second oxide (e.g., a thickness of the second oxide) may be configured to enable the second device to operate in a second electrical domain of operation corresponding to a second RF band. For example, the first gate oxide and the second gate oxide may be formed according to at least a portion of the method 400 of FIG. 4.

First gate material of the first device may be formed on the first region, and second gate material of the second device may be formed on the second region, at 508. For example, the first gate material and the second gate material may be formed during a common gate formation process performed on the first region and the second region.

Processing is performed on a first region and a second region, at 510. The processing may construct (e.g., fabricate) the first device to operate at the first RF band and to construct the second device to operate at the second RF band. The processing may include performing first processing on the first region, at 512, and performing second processing on the second region, at 514. The first processing and the second processing may correspond to a same characteristic type of the first device and the second device. For example, the characteristic type may include a channel length, a gate oxide thickness, a lightly doped region characteristic, a halo region characteristic, or a combination thereof. A first value of the characteristic type of the first device may be different than a second value of the characteristic type of the second device. For example, when the first device is designed to operate at a lower RF band than the second device, a first channel length of the first device may be longer than a second channel length of the second device, a first gate oxide thickness of the first device may be thicker than a second gate oxide thickness of the second device, a first lightly doped region characteristic (e.g., a profile volume, a profile cross sectional area, a profile cross sectional shape, a dopant concentration, or a dopant type) of the first device may be different than a second lightly doped region characteristic of the second device, a first halo region characteristic (e.g., a profile volume, a profile cross sectional area, a profile cross sectional shape, a dopant concentration, or a dopant type) of the first device may be greater than a second halo region characteristic of the second device, or a combination thereof.

Second common processing may be performed on the first region and the second region, at 516. The second common processing may include forming spacers, forming n source/drain implants, p source/drain implants, silicides, contacts, metal 1 layers, vias, metal 2 layers, or a combination thereof.

The method 300 of FIG. 3, the method 400 of FIG. 4, the method 500 of FIG. 5, or any combination thereof, may be initiated or controlled by a field-programmable gate array (FPGA) device, an application-specific integrated circuit (ASIC), a processing unit, such as a central processing unit (CPU), a digital signal processor (DSP), a controller, another hardware device, a firmware device, or any combination thereof. As an example, the method 300 of FIG. 3, the method 400 of FIG. 4, or the method 500 of FIG. 5 can be initiated or controlled by one or more processors, operating systems, or controllers.

Figure 6:
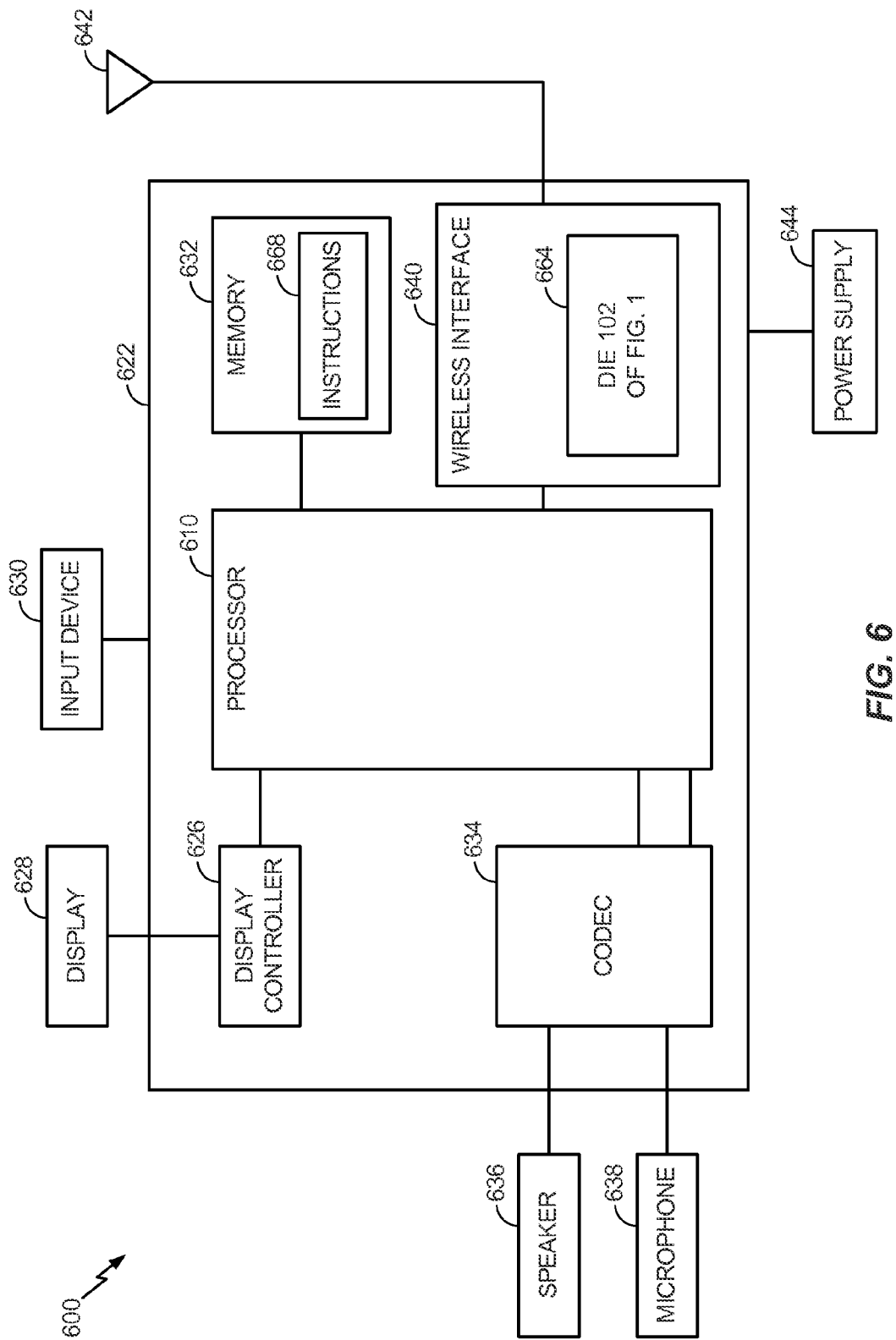
FIG. 6 is a block diagram of a device including the die of FIG. 1.

Referring to FIG. 6, a block diagram of a particular illustrative embodiment of a wireless communication device 600 is depicted. The device 600 may include, or have incorporated therein, the die 102 of FIG. 1.

The device 600 includes a processor 610, such as a digital signal processor (DSP), coupled to a memory 632. The memory 632 includes instructions 668 (e.g., executable instructions) such as computer-readable instructions that are readable by the processor 610. The instructions 668 may include one or more instructions that are executable by a computer, such as the processor 610.

FIG. 6 also shows a display controller 626 that is coupled to the processor 610 and to a display 628. A coder/decoder (CODEC) 634 can also be coupled to the processor 610. A speaker 636 and a microphone 638 can be coupled to the CODEC 634.

FIG. 6 also indicates that a wireless interface 640 can be coupled to the processor 610 and to an antenna 642. The wireless interface 640 may include a wireless controller, a wireless transceiver, such as a receiver circuit, a transmitter circuit, or a combination thereof. The wireless interface 640 may include a device 664, such as the die 102 of FIG. 1. For example, the device 664 may include a first radio frequency (RF) component and a second RF component, such as the first device 112 and the second device 122 of FIG. 1. For example, the first RF component and the second RF component may each include a power amplifier, an antenna switch, a low noise amplifier, or one or more transistors. Accordingly, the first RF component and the second RF component may be included in a receiver circuit, a transmitter circuit, or a combination thereof. The device 664 may be a chip (e.g., a single chip) configured to accommodate multiple radio frequency (RF) bands. In an alternative embodiment, the device 664 may be located in one or more components of the device 600 other than in the wireless interface 640.

In a particular embodiment, the processor 610, the display controller 626, the memory 632, the CODEC 634, and the wireless interface 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the wireless antenna 642, and the power supply 644 are external to the system-on-chip device 622. However, each of the display 628, the input device 630, the speaker 636, the microphone 638, the antenna 642, and the power supply 644 can be coupled to a component of the system-on-chip device 622, such as an interface or a controller.

One or more of the disclosed embodiments may be implemented in a system or an apparatus, such as the device 600, that may include a communications device, a fixed location data unit, a mobile location data unit, a mobile phone, a cellular phone, a satellite phone, a computer, a tablet, a portable computer, or a desktop computer. Additionally, the device 600 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof.

Figure 7:
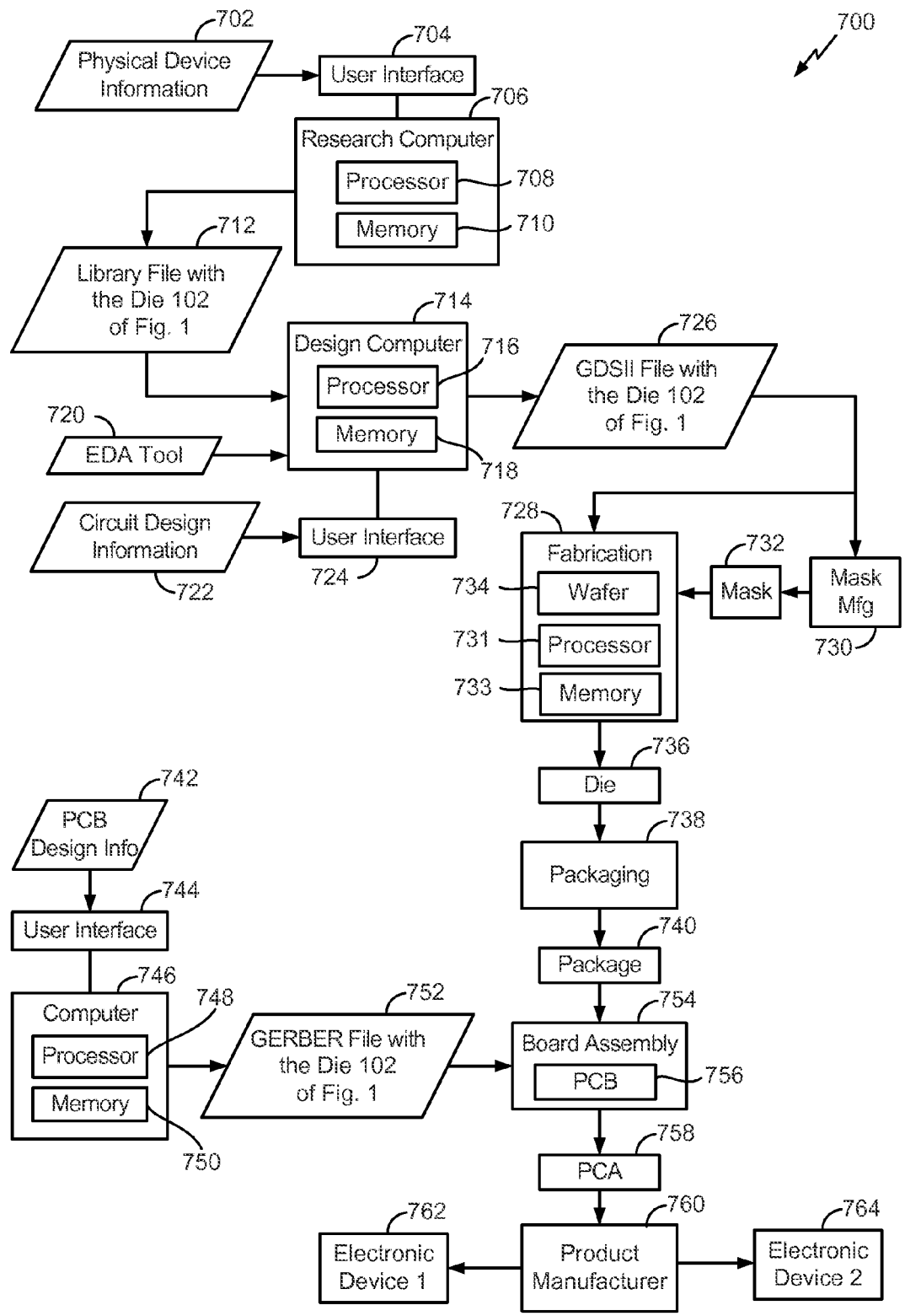
FIG. 7 is a data flow diagram of an illustrative embodiment of a manufacturing process including the die of FIG. 1.

The foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 7 depicts a particular illustrative embodiment of an electronic device manufacturing process 700.

Physical device information 702 is received at the manufacturing process 700, such as at a research computer 706. The physical device information 702 may include design information representing at least one physical property of a semiconductor device, such as a semiconductor device including the die 102 of FIG. 1. For example, the physical device information 702 may include physical parameters, material characteristics, and structure information that is entered via a user interface 704 coupled to the research computer 706. The research computer 706 includes a processor 708, such as one or more processing cores, coupled to a computer-readable medium such as a memory 710. The memory 710 may store computer-readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including a device that includes the die 102 of FIG. 1, that is provided to use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor-executable instructions at the memory 718 to enable a user of the design computer 714 to design a circuit including the die 102 of FIG. 1, of the library file 712. For example, a user of the design computer 714 may enter circuit design information 722 via a user interface 724 coupled to the design computer 714. The circuit design information 722 may include design information representing at least one physical property of a semiconductor device, such as a semiconductor device that includes the die 102 of FIG. 1. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format (e.g., a GDSII format). The design computer 714 may be configured to generate a data file including the transformed design information, such as a GDSII file 726 that includes information describing the die 102 of FIG. 1, in addition to other circuits or information. To illustrate, the data file may include information corresponding to a system-on-chip (SOC) that includes the die 102 of FIG. 1, and that may also include additional electronic circuits and components within the SOC.

The GDSII file 726 may be received at a fabrication process 728 to manufacture a wafer including the die 102 of FIG. 1, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, such as a silicon on insulator (SOI) wafer, a silicon on silicon (SOS) wafer, or a bulk silicon wafer. For example, the wafers 734 may correspond to the wafer 202 of FIG. 2A or the wafer 292 of FIG. 2B, which may be tested and separated into dies, such as a representative die 736. The die 736 may include or correspond to the die 102 of FIG. 1.

In a particular embodiment, the fabrication process 728 is implemented by a computer including a processor 731 and a memory 733. The memory 733 (e.g., a non-transitory computer-readable medium) may include instructions that are executable by the processor 731 to cause the processor 731 to operate in accordance with at least a portion of any of the method 300 of FIG. 3, the method 400 of FIG. 4, the method 500 of FIG. 5, or any combination thereof. For example, the computer-executable instructions may be executable to cause the processor 731 to initiate formation of a complementary metal-oxide-semiconductor (CMOS) device. The formation of the CMOS device includes forming a first gate oxide in a first region and in a second region of a wafer, such as a silicon on insulator (SOI) wafer, a silicon on silicon (SOS) wafer, or a bulk silicon wafer. The CMOS device is further formed by performing first processing to form a second gate oxide in the second region. The second gate oxide has a different thickness than the first gate oxide. The formation of the CMOS device also includes forming first gate material of a first device in the first region and forming second gate material of a second device in the second region. The first device corresponds to (e.g., is configured to operate in) a first radio frequency (RF) band, and the second device corresponds to (e.g., is configured to operate in) a second RF band that is different from the first RF band.

As another example, the computer-executable instructions may be executable to cause the processor 731 to initiate performing a complementary metal-oxide-semiconductor (CMOS) process to form a first radio frequency (RF) circuit and a second RF circuit. The first RF circuit is designed to operate at a first RF band, and the second RF circuit is designed to operate at a second RF band that is different from the first RF band. The CMOS process includes forming a first RF device of the first RF circuit and forming a second RF device of the second RF circuit. The first RF device has a first device type and a first value of a characteristic, and the second RF device has a second device type and a second value of the characteristic. The first device type and the second device type are a same device type, and the first value of the characteristic is different from the second value of the characteristic.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor-executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the die 102 of FIG. 1.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the die 102 of FIG. 1. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer, into which the die 102 of FIG. 1 is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the die 102 of FIG. 1, may be fabricated, processed, and incorporated into an electronic device, as described in the illustrative process 700. One or more aspects of the embodiments disclosed with respect to FIGS. 1-6 may be included at various processing stages, such as within the library file 712, the GDSII file 726, and the GERBER file 752, as well as stored at the memory 710 of the research computer 706, the memory 718 of the design computer 714, the memory 733 of a computer associated with the fabrication process 728, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

In conjunction with one or more of the described embodiments, an apparatus is disclosed that may include a first radio frequency (RF) component corresponding to (e.g., configured to operate in) a first RF band, and a second RF component corresponding to (e.g., configured to operate in) a second RF band that is different from the first RF band. The first RF component may include first means for gating a first channel. The first means for gating may correspond to the first gate 242 or the second gate 262 of FIGS. 2A-B, one or more other devices or circuits configured to gate the first channel, or any combination thereof. The first channel may be positioned between first means for sourcing first current to the first channel and first means for draining the first current from the first channel. The first means for sourcing may correspond to one of the S/D implants 210 of FIGS. 2A-B, one or more other devices or circuits configured to source the first current to the first channel, or any combination thereof. The first means for draining may correspond to another of the S/D implants 210 of FIGS. 2A-B, one or more other devices or circuits configured to drain the first current from the first channel, or any combination thereof. The first means for gating the first channel is insulated from first semiconductor means for conducting first charge carriers by a first insulator. The first semiconductor means for conducting may correspond to the semiconducting layer 208 of FIG. 2A, the substrate 294 of FIG. 2B, one or more other devices or circuits configured to conduct the first charge carriers, or any combination thereof. The first insulator may correspond to the insulator material 206 of FIG. 2A, one or more other materials configured to insulate the first means for gating from the first semiconductor means for conducting, or any combination thereof.

The second RF component of the apparatus may include second means for gating a second channel. The second means for gating may correspond to the first gate 242 or the second gate 262 of FIGS. 2A-B, one or more other devices or circuits configured to gate the second channel, or any combination thereof. The second channel may be positioned between second means for sourcing second current to the second channel and second means for draining the second current from the second channel. The second means for sourcing may correspond to the S/D implants 210 of FIGS. 2A-B, one or more other devices or circuits configured to source the second current to the second channel, or any combination thereof. The second means for draining may correspond to the S/D implants 210 of FIGS. 2A-B, one or more other devices or circuits configured to drain the second current from the second channel, or any combination thereof. The second means for gating the second channel is insulated from the second semiconductor means for conducting first charge carriers by a second insulator. The second semiconductor means for conducting may correspond to the semiconducting layer 208 of FIG. 2A, the substrate 294 of FIG. 2B, one or more other devices or circuits configured to conduct the second charge carriers, or any combination thereof. The second insulator may correspond to the insulator material 206 of FIG. 2A, one or more other materials circuits configured to insulate the second means for gating from the second semiconductor means for conducting, or any combination thereof. A first thickness of the first insulator is different than a second thickness of the second insulator.

In conjunction with the described embodiments, a method is disclosed that may include a step for forming a first gate oxide in a first region and in a second region of a wafer, such as described in the method 300 of FIG. 3 at 302, the method 400 of FIG. 4 at 402, 404, described in the method 500 of FIG. 5 at 504, a deposition process, a lithography process, an etch process, one or more other processes configured to form the first gate oxide in the first region and in the second region of the wafer, or any combination thereof. The method may also include a step for performing first processing to form a second gate oxide in the second region, such as described in the method 300 of FIG. 3 at 304, the method 400 of FIG. 4 at 402, 406, described in the method 500 of FIG. 5 at 504, a deposition process, a lithography process, an etch process, one or more other processes configured to perform the first processing to for the second gate oxide in the second region, or any combination thereof. The method may also include a step forming first gate material of a first device in the first region and forming second gate material of a second device in the second region, such as the as described in the method 300 of FIG. 3 at 302, 304, the method 400 of FIG. 4 at 408, described in the method 500 of FIG. 5 at 508, a deposition process, a lithography process, an etch process, one or more other processes configured to form the first gate material of the first device in the first region and form the second gate material of the second device in the second region, or any combination thereof. The first device corresponds to a first radio frequency (RF) band, and the second device corresponds to a second RF band that is different from the first RF band.

Although one or more of FIGS. 1-7 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor-executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
a first radio frequency (RF) component on a die, wherein the first RF component includes a first gate oxide having a first thickness, and wherein the first RF component is customized to operate in a first RF band associated with a first frequency; and
a second RF component on the die, wherein the second RF component includes a second gate oxide having a second thickness that is less than the first thickness, and wherein the second RF component is customized to operate in a second RF band associated with a second frequency that is greater than the first frequency.

2. The device of claim 1, wherein the first RF component and the second RF component are complementary metal-oxide-semiconductor (CMOS) components.

3. The device of claim 1, wherein the second RF component is fabricated by a process that includes forming a layer of the first gate oxide, removing a portion of the first gate oxide on a region of the die, and forming a layer of the second gate oxide on the region.

4. The device of claim 1, wherein the first RF component comprises a low band power amplifier, and wherein the second RF component comprises a high band power amplifier.

5. The device of claim 1, wherein the first RF component and the second RF component comprise semiconductor devices that are integrated in the die.

6. The device of claim 1, wherein the die is integrated into a mobile phone, a cellular phone, a communications device, a portable computer, a set top box, an entertainment unit, a navigation device, a personal digital assistant (PDA), a fixed location data unit, a mobile location data unit, a computer, a desktop computer, a monitor, a computer monitor, a television, a tuner, a radio, a satellite radio, a music player, a digital music player, a portable music player, a video player, a digital video player, a digital video disc (DVD) player, a portable digital video player, or a combination thereof.

7. The device of claim 1, wherein the first RF component is configured to operate in a first electrical domain and the second RF component is configured to operate in a second electrical domain, and wherein the first electrical domain is separate from the second electrical domain.

8. The device of claim 1, wherein:
the first RF component includes a first insulator material, the second RF component includes a second insulator material, and the first insulator material is thicker than the second insulator material.

9. The device of claim 1, wherein:
the first RF component includes a first semiconducting layer, the second RF component includes a second semiconducting layer, and the first semiconducting layer is thicker than the second semiconducting layer.

10. The device of claim 1, wherein:
the first RF component includes a first gate, the second RF component includes a second gate, and the first gate is of a greater length than the second gate.

11. The device of claim 1, wherein:
the first RF component includes a first spacer, the second RF component includes a second spacer, and the first spacer is thicker than the second spacer.

12. The device of claim 1, wherein:
the first RF component includes a first doped region having a first doped profile, the second RF component includes a second doped region having a second doped profile, and a first cross sectional area of the first doped profile is greater than a second cross sectional area of the second doped profile.

13. The device of claim 1, wherein:
the first RF component includes a first doped region having a first dopant, the second RF component includes a second doped region having a second dopant, and the first dopant has a larger molecular mass than the second dopant.

14. The device of claim 1, wherein:
the first RF component includes a first doped region having a first concentration of a first dopant, the second RF component includes a second doped region having a second concentration of a second dopant, and the first concentration is greater than the second concentration.

15. The device of claim 1, wherein:
the first RF component includes a first halo region having a first halo profile, the second RF component includes a second halo region having a second halo profile, and a first cross sectional area of the first halo profile is greater than a second cross sectional area of the second halo profile.

16. The device of claim 1, wherein:
the first RF component includes a first halo region having a first halo dopant, the second RF component includes a second halo region having a second halo dopant, and the first halo dopant has a larger molecular mass than the second halo dopant.

17. The device of claim 1, wherein:
the first RF component includes a first halo region having a first dopant concentration of a first halo dopant, the second RF component includes a second halo region having a second dopant concentration of a second halo dopant, and the first dopant concentration is greater than the second dopant concentration.

18. An apparatus comprising:
a first radio frequency (RF) component customized to operate in a first RF band associated with a first frequency, the first RF component comprising:
first means for gating a first channel, the first channel positioned between first means for sourcing first current to the first channel and first means for draining the first current from the first channel, wherein the first means for gating the first channel is insulated from first semiconductor means for conducting first charge carriers by a first insulator; and
a second radio frequency (RF) component customized to operate in a second RF band associated with a second frequency that is greater than the first frequency, the second RF component comprising:
second means for gating a second channel, the second channel positioned between second means for sourcing second current to the second channel and second means for draining the second current from the second channel, wherein the second means for gating the second channel is insulated from second semiconductor means for conducting second charge carriers by a second insulator, and wherein a first thickness of the first insulator is greater than a second thickness of the second insulator.

19. The apparatus of claim 18, wherein the first RF component and the second RF component are complementary metal-oxide-semiconductor (CMOS) components.

20. The apparatus of claim 18, wherein the first RF component and the second RF component comprise a same component type, wherein the first RF component and the second RF component comprise a same characteristic type, and wherein a first value of the same characteristic type of the first RF component is greater than a second value of the same characteristic type of the second RF component.

21. The apparatus of claim 20, wherein the same component type is one of a power amplifier, a switch, or a low noise amplifier.

22. The apparatus of claim 20, wherein the same characteristic type is associated with an oxide thickness, a channel length, a spacer profile area, a halo profile area, a lightly doped profile area, or a combination thereof.

23. The apparatus of claim 18, wherein the first RF component is included in a receiver circuit, a transmitter circuit, or a combination thereof.

24. The apparatus of claim 18, wherein the first RF component and the second RF component are integrated in at least one semiconductor die.

25. The apparatus of claim 18, wherein the first RF component and the second RF component are integrated into a mobile phone, a cellular phone, a communications device, a portable computer, a set top box, an entertainment unit, a navigation device, a personal digital assistant (PDA), a fixed location data unit, a mobile location data unit, a computer, a desktop computer, a monitor, a computer monitor, a television, a tuner, a radio, a satellite radio, a music player, a digital music player, a portable music player, a video player, a digital video player, a digital video disc (DVD) player, a portable digital video player, or a combination thereof.

* * * * *